United States Patent [19]

Berniere

[11] 4,130,812
[45] Dec. 19, 1978

[54] BAND PASS ELECTROMECHANICAL FILTERS

[75] Inventor: Michel G. Berniere, Louveciennes, France

[73] Assignee: Societe Anonyme de Telecommunications, Paris, France

[21] Appl. No.: 793,064

[22] Filed: May 2, 1977

[30] Foreign Application Priority Data

May 15, 1976 [FR] France .................... 76 13345

[51] Int. Cl.² .................... H03H 9/02; H03H 9/26
[52] U.S. Cl. .................... 333/71; 333/72
[58] Field of Search ............ 333/71, 72, 30 M, 30 R; 310/321, 323, 328, 329, 330, 331, 332, 333

[56] References Cited

FOREIGN PATENT DOCUMENTS 2262885  9/1975  France .................... 333/71

*Primary Examiner*—Alfred E. Smith
*Assistant Examiner*—Marvin Nussbaum
*Attorney, Agent, or Firm*—Jacobs & Jacobs

[57] ABSTRACT

A band pass electromechanical filter of the type comprising an input electromechanical transducer and an output electromechanical transducer and a mechanical filter vibrating in compression-extension mode, disposed between said transducers and comprising a plurality of cylindrical resonators connected to one another by coupling rods, each resonator being formed with a flat portion at the end(s) upon which at least one coupling rod should be secured, each coupling rod being welded onto said flat portion along one generatrix, said generatrix being parallel to the resonator axis, each coupling rod having its end in abutment with a shoulder which terminates the flat portion, the cross-sectional area of the resonator outside the flat portion being equal to the sum of the cross-sectional area of the resonator in the section comprising the flat portion and the cross-sectional areas of the coupling rod(s) secured on said flat portion.

3 Claims, 3 Drawing Figures

BAND PASS ELECTROMECHANICAL FILTERS

The present invention relates to band pass electromechanical filters vibrating in longitudinal mode.

Electromechanical filter are known to comprise three parts: two electromechanical transducers and a mechabical filter therebetween. The electromechanical transducers, the function of which is to convert the alternating electric currents into mechanical vibrations, or vice-versa, are not within the scope of the present invention which is directed to the mechanical filter.

A mechanical filter comprises a plurality of cylindrical resonators coupled to each other by coupled rods. Resonators and coupling rods vibrate in longitudinal mode, the resonators vibrating in half-wave and the coupling rods in quarter-wave of the central frequency of the filter pass-band.

One major difficulty in mechanical filters lies in defining a satisfactory connection mode between resonator and coupling rod. The connection between resonator and coupling rod must be such that the acoustic impedance be constant throughout the resonator, especially at its ends where connection must be provided. Since the impedance is proportional to the cross-sectional area, this amounts to providing a constant cross-sectional area for the assembly defined between the resonator end surfaces, said assembly possibly comprising in addition to the resonator, the end portions of the coupling rods used to achieve the connection.

This requirement is critical in the case of filters designed for telephonic applications because the required relative accuracy is very high. Any alteration of the cross-sectional area, even small, will cause occurence of unacceptable and uncontrollable disturbances.

A connection mode providing a constant cross-sectional area consists in forming in the resonator end face a blind bore for engagement of the end of the coupling rod and a providing connection by tin brazing. The achievement of such a connection however is difficult since it involves the steps of drilling the blind bore exactly to the required depth, pickling the inner walls of the bore brazing and finally removing the tin burrs. Such a connection technique is thus hardly to be contemplated for large scale production.

French Addition Patent Application No. 2,262,885 teaches another connection method, which comprises welding the coupling rods on a flat portion formed at the end of the resonator, the coupling rods being positioned obliquely in such manner that their ends are flush with the resonator end surface adjacent the flat portion. With such an arrangement however, a constant impedance for the resonator cannot be provided. Moreover, the welding operation is still troublesome due to the difficulties encountered in positioning the coupling rods.

The aim of the invention is to provide a mechanical filter in which the resonators have a constant impedance throughout their lengths and the connection between resonators and coupling rods is easy to achieve in large scale production.

According to the invention, there is provided a band pass electromechanical filter of the type comprising an input electromechanical transducer and an output electromechanical transducer and a mechanical filter vibrating in extension-compression mode, disposed between said transducers and comprising a plurality of cylindrical resonators connected to each other through coupling rods, each resonator being formed with a flat portion at the end or ends where at least one coupling rod is to be secured, each coupling rod being welded onto said flat portion along one of its generatrix, said generatrix being parallel to the resonator axis, each coupling rod having its end surface in abutment with a shoulder which terminates said flat portion, the cross-sectional area of the resonator outside the flat portion being equal to the sum of the cross-sectional area of the resonator within the section comprising the flat portion and the cross-sectional areas of the coupling rod(s) or secured on said flat portion.

By construction, the resonator cross-sectional area is constant throughout its length. The area therefore depends on the depth of the flat portion and the number and cross-sectional area of the coupling rods secured on said flat portion If the filter is arranged in line, each resonator will comprise flat portions at both ends since a coupling rod will be secured to each of its ends. If the filter has a folded structure, which is advantageous in view of its improved compactness, each resonator has formed thereon a single flat portion on which two coupling rods are secured, save for the end resonators connected to the transducers.

Further, the attachment of the coupling rods is easy to achieve by resistance welding or by any other suitable welding technique without filler material, and they will be positioned during welding by placing them in abutment with the shoulder which terminates the flat portion.

In the case where the filter has a folded structure, the resonator may comprise throughout its length outside of the flat portion a smaller flat portion which terminates at said shoulder.

Of course, the depth of said smaller flat portion will be determined so as to exactly compensate for the diminution of cross-sectional area at the end of the resonator. This arrangement is advantageous since it allows achieving all the weldings in one pass. Placing in alignment the flat portions of a row of resonators suffices to provide alignment of the flat protions designed for receiving the coupling rods. The required positioning of the resonators in view of their welding is thereby achieved very quickly.

The invention will become more apparent from the following description when taken in conjunction with the accompanying drawing in which.

Figure 1:
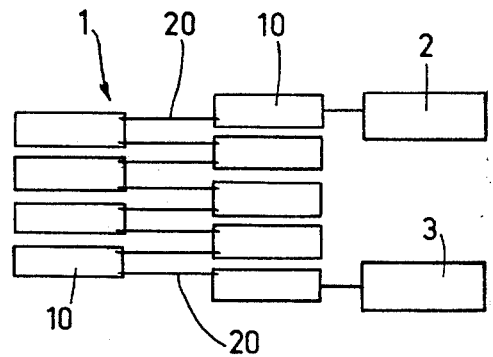
FIG. 1 is a plan view of an electromechanical filter according to the invention in the case of a folded structure filter.

The electromechanic filter shown in FIG. 1 comprises a mechanical filter which is labelled with the general reference numeral 1, disposed between the input and output electromechanic transducers 2 and 3, the terminals of which have not been represented.

The mechanical filter 1 comprises a plurality of resonators 10 of circular cross-section connected to each other by coupling rods 20 also of circular cross section. The shown mechanical filter is of the folded structure type, the resonators 10 being arranged in tow rows and staggered. This arrangement is advantageous in practice due to its compactness, but the invention covers also any other possible arrangements of the mechanical filter, in particular the the arrangement along one line.

As regards the coupling rods, it may be provided either coupling rods with the same diameter and different lengths, or coupling rods of the same length and different diameters. The invention covers both cases as well, but the embodiment shown in FIGS. 2 and 3 comprises coupling rods of different diameters.

The end of resonator 10 is formed with a flat 11 on which the coupling rods 20' and 20" are resistance welded, coupling rod 20' having a diameter which is larger than that of coupling rod 20". Resonator 10 is further formed with a flats 12 throughout its length, shallower than flat 11, said flat 11 and 12 having at the juncture thereof a transverse surface 13 with which the end surfaces of the coupling rods 20' and 20" are in abutment.

The flat 12 is designed so that the cross-sectional area of the resonator in its section comprising the flat 12 is equal to the cross-sectional area of the resonator in its end portion comprising the flat 11 plus the cross-sectional areas of the coupling rods 20' and 20". A constant cross-sectional area is thereby provided throughout the assembly defined between the end surfaces of resonator 10 and the impedance is therefore constant throughout the resonator.

Flats 11 and 12 are not necessarily plane surfaces, and they may comprise curved surfaces of great radius. This permits forming them by turning, instead of the more expensive method comprising milling followed by surface grinding which should be used to obtain absolutely plane surfaces.

Figure 3:
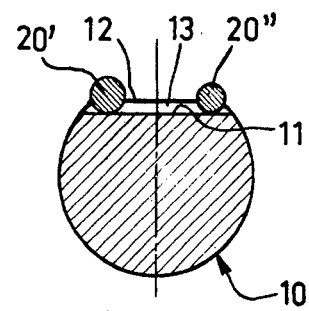
FIG.3 is a sectional view along line III—III of FIG. 2

It can be seen from FIG. 3 that coupling rods 20 are protruding in relation to flat 12, which facilitates the welding operation in the case of electrical welding since nothing opposes the movement of the electrodes.

Figure 2:
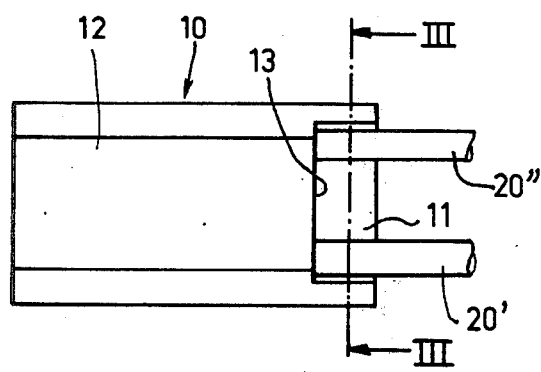
FIG. 2 is a view at a larger scale of a detail of FIG. 1.

Of course, in the case of end resonators upon which a single coupling rod is secured at each end, the depth of flat 12 should be determined in such manner as to meet the requirement of a constant cross-sectional area and will therefore be less than in the case shown in FIGS. 2 and 3.

What I claim is:

1. A band pass electromechanical filter of the type comprising an input electromechanical transducer and an output electromechanical transducer and a mechanical filter vibrating in compression-extension mode, disposed between said transducers and comprising a plurality of cylindrical resonators connected to one another by coupling rods, each resonator being formed with a flat portion at the end (s) upon which at least one coupling rod is secured, the plane of said flat portion being parallel to the longitudinal axis of the resonator, each coupling rod being welded onto said flat portion along one generatrix thereof, said generatrix being parallel to the resonator axis, each coupling rod having its end in abutment with a shoulder which terminates the flat portion, the cross-sectional area of the resonator outside the flat portion being equal to the sum of the cross-sectional area of the resonator in the section comprising the flat portion and the cross-sectional area of the coupling rod (s) secured on said flat portion.

2. A filter according to claim 1, arranged in a folded structure, wherein the resonator comprises throughout its length outside the flat portion(s) a smaller flat portion which terminates at said shoulder.

3. A filter according to claim 2, wherein said flat portions are part cylindrical surfaces having a very large diameter in relation to that of the resonator.

* * * * *

UNITED STATES PATENT AND TRADEMARK OFFICE
CERTIFICATE OF CORRECTION

PATENT NO. : 4,130,812
DATED : December 19, 1978
INVENTOR(S) : MICHEL G. BERNIERE It is certified that error appears in the above-identified patent and that said Letters Patent are hereby corrected as shown below:

In item 30 on the title page, change the priority date from "May 15, 1976" to -- May 5, 1976 --.

Signed and Sealed this

Twenty-seventh Day of November 1979

[SEAL]

Attest:

RUTH C. MASON
Attesting Officer

LUTRELLE F. PARKER
Acting Commissioner of Patents and Trademarks